(12) United States Patent
Chuang et al.

(10) Patent No.: US 12,216,407 B2
(45) Date of Patent: Feb. 4, 2025

(54) METHOD AND APPARATUS FOR MULTI-SPRAY RRC PROCESS WITH DYNAMIC CONTROL

(71) Applicant: Taiwan Semiconductor Manufacturing Co., Ltd., Hsin-Chu (TW)

(72) Inventors: Ming-Hsuan Chuang, Hsinchu (TW); Po-Sheng Lu, Hsinchu (TW); Shou-Wen Kuo, Hsinchu (TW); Cheng-Yi Huang, Hsinchu (TW); Chia-Hung Chu, Pingzhen (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 80 days.

(21) Appl. No.: 18/114,690

(22) Filed: Feb. 27, 2023

(65) Prior Publication Data

US 2023/0221645 A1    Jul. 13, 2023

Related U.S. Application Data

(63) Continuation of application No. 16/684,457, filed on Nov. 14, 2019, now Pat. No. 11,592,748.

(60) Provisional application No. 62/773,446, filed on Nov. 30, 2018.

(51) Int. Cl.
   G03F 7/16     (2006.01)
   G03F 7/004    (2006.01)
   H01L 21/027   (2006.01)

(52) U.S. Cl.
   CPC ............ *G03F 7/162* (2013.01); *G03F 7/0048* (2013.01); *H01L 21/0273* (2013.01)

(58) Field of Classification Search
   CPC ...................................... G03F 7/162
   See application file for complete search history.

(56) References Cited

U.S. PATENT DOCUMENTS

| 5,658,615 | A  | 8/1997 | Hasebe et al. |
| 5,857,619 | A  | 1/1999 | Huang et al. |
| 7,718,551 | B2 | 5/2010 | Liu et al. |

(Continued)

FOREIGN PATENT DOCUMENTS

| JP | 2006156565 A | 6/2006 |
| TW | 200938956 A  | 9/2009 |

*Primary Examiner* — James M Mellott
(74) *Attorney, Agent, or Firm* — Duane Morris LLP

(57) ABSTRACT

A multi-spray RRC process with dynamic control to improve final yield and further reduce resist cost is disclosed. In one embodiment, a method, includes: dispensing a first layer of solvent on a semiconductor substrate while spinning at a first speed for a first time period; dispensing the solvent on the semiconductor substrate while spinning at a second speed for a second time period so as to transform the first layer to a second layer of the solvent; dispensing the solvent on the semiconductor substrate while spinning at a third speed for a third time period so as to transform the second layer to a third layer of the solvent; dispensing the solvent on the semiconductor substrate while spinning at a fourth speed for a fourth time period so as to transform the third layer to a fourth layer of the solvent; and dispensing a first layer of photoresist on the fourth layer of the solvent while spinning at a fifth speed for a fifth period of time.

20 Claims, 5 Drawing Sheets

(56) References Cited

U.S. PATENT DOCUMENTS

| | | | |
|---|---|---|---|
| 9,028,915 B2 | 5/2015 | Chang et al. | |
| 2009/0227120 A1* | 9/2009 | Liu | G03F 7/162 |
| | | | 438/782 |
| 2014/0065843 A1* | 3/2014 | Chang | H01L 21/6715 |
| | | | 438/782 |
| 2015/0243500 A1 | 8/2015 | Chang et al. | |
| 2018/0052394 A1* | 2/2018 | Sagae | G03F 7/3021 |

\* cited by examiner

METHOD AND APPARATUS FOR MULTI-SPRAY RRC PROCESS WITH DYNAMIC CONTROL

CROSS-REFERENCE OF RELATED APPLICATION

This application is a Continuation Application of U.S. patent application Ser. No. 16/684,457, filed Nov. 14, 2019, which claims priority to U.S. Provisional Application No. 62/773,446, filed Nov. 30, 2018, the contents of each are incorporated by reference herein in their entireties.

BACKGROUND

During semiconductor fabrication, a variety of photolithographic processes are performed to apply layers to, or perform implants in, a semiconductor wafer. A photosensitive photoresist is applied to the wafer, and patterned using a photomask to form a hard mask for a subsequent deposition or etching process. The cost of photoresist is a significant material cost in semiconductor fabrication. RRC (Reducing Resist Consumption) process is widely used in the Semiconductor industry to decrease the cost of photo resist per wafer. However, the process is often accompanied with various coating defects (e.g., microbubbles) that make it difficult to improve final yield and further reduce resist cost per wafer. This disclosure exploit a multi-spray RRC process with dynamic control to improve final yield and further reduce resist cost.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

This disclosure presents various embodiments of a multi-spray RRC process with dynamic control to improve final yield and further reduce resist cost.

Figure 1:
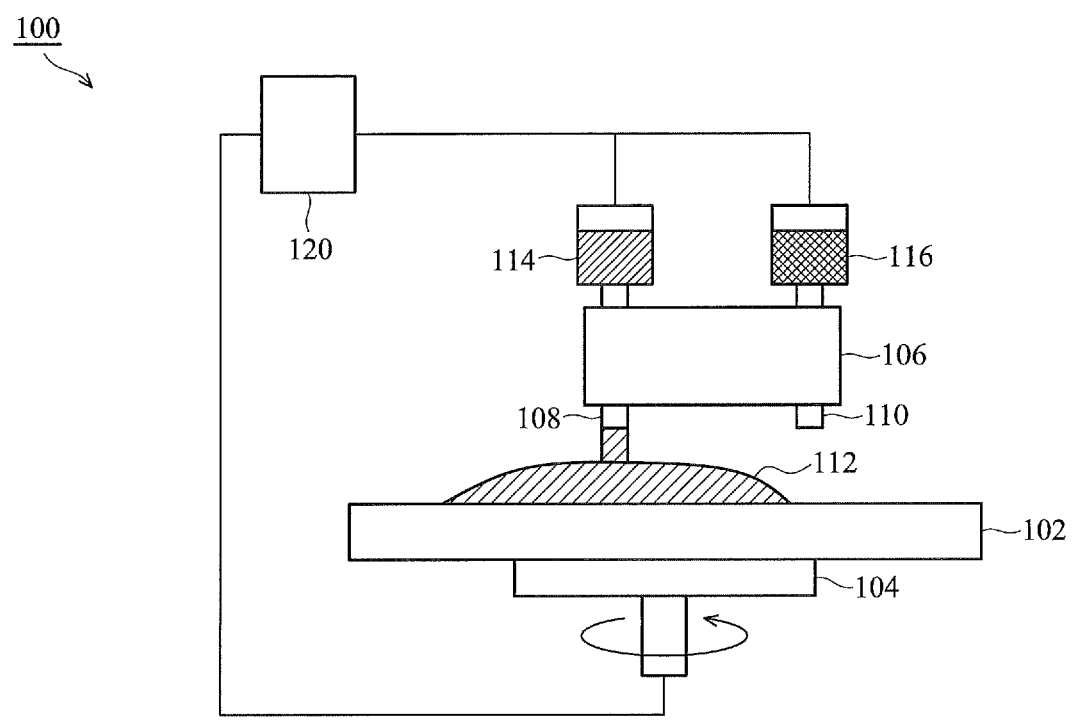
FIG. 1 illustrates an exemplary block diagram of a spin coater system for coating a semiconductor wafer with a thin film, in accordance with some embodiments of present disclosure.

FIG. 1 illustrates an exemplary block diagram of a spin coater system 100 for coating a semiconductor wafer with a thin film, in accordance with some embodiments of present disclosure. It is noted that the system 100 is merely an example, and is not intended to limit the present disclosure. Accordingly, it is understood that additional functional blocks may be provided in or coupled to the system 100 of FIG. 1, and that some other functional blocks may only be briefly described herein.

In the illustrated embodiment, the spin coater system 100 is to deposit a uniform thin film to a surface of a flat substrate 102 using centrifugal force. In some embodiments, the thin film can comprises sol-gel precursors and photoresist. In some embodiments, the system 100 comprises a chuck 104 for securing the substrate 102 firmly without deflection while operating at a very high rotational speed. In some embodiments, the chuck 104 has a mass that allows for instantaneous direction and speed change with precise acceleration and deceleration control. In sonic embodiments, the chuck 104 is a vacuum chuck. In some embodiments, the vacuum chuck 104 comprises a low-profile, O-ring seal for high-performance vacuum seal. In some other embodiments, the chuck 104 comprises an edge-grip chuck for substrates that are sensitive to vacuum contact. In some embodiments, the chuck 104 is attached to a motor (not shown) which is configured to provide precise speed control.

In some embodiments, the system 100 comprises a holder 106 with at least one nozzle 108/110 for dispensing a coating 112 onto the substrate 102. In the illustrated embodiment, the system 100 comprises 2 nozzles 108/110 with a first nozzle 108 for dispensing an reducing resist consumption (RRC) solvent from a RRC source 114 and a second nozzle 110 for dispensing a polymer (e.g., photoresist) from a photoresist source 116. In some embodiments, the RRC solvent source 114 and the photoresist source 116 each comprises a respective pump (not shown) for injecting the materials into the respective nozzles. In some embodiments, the RRC solvent and photoresist are both directed through a single nozzle and injected by a single pump.

In some embodiments, the pump attached to the material source 114/116 is further coupled to a controller 120 to control the time and rate of the dispensing of the coating. In some embodiments, the controller 120 is further coupled to the motor coupled to the chuck 104 so as to control the speed, acceleration/deceleration, and spinning time of the chuck 104. In some embodiments, the dispensing of the coating and the spinning of the chuck are synchronized and automatically controlled by the controller 120.

In some embodiments, the controller 120 is a representative device and may comprise a processor, a memory, an input/output interface, a communications interface, and a system bus. The processor may comprise any processing circuitry operative to control the operations and performance of the controller 120. In various aspects, the processor may be implemented as a general purpose processor, a chip multiprocessor (CMP), a dedicated processor, an embedded processor, a digital signal processor (DSP), a network processor, an input/output (I/O) processor, a media access control (MAC) processor, a radio baseband processor, a co-processor, a microprocessor such as a complex instruction set computer (CISC) microprocessor, a reduced instruction set computing (RISC) microprocessor, and/or a very long instruction word (VLIW) microprocessor, or other processing device. The processor also may be implemented by a controller, a microcontroller, an application specific integrated circuit (ASIC), a field programmable gate array (FPGA), a programmable logic device (PLD), and so forth.

In various aspects, the processor may be arranged to run an operating system (OS) and various applications. Examples of an OS comprise, for example, operating systems generally known under the trade name of Apple OS, Microsoft Windows OS, Android OS, and any other proprietary or open source OS.

In some embodiments, at least one non-transitory computer-readable storage medium is provided having computer-executable instructions embodied thereon, wherein, when executed by at least one processor, the computer-executable instructions cause the at least one processor to perform embodiments of the methods described herein. This computer-readable storage medium can be embodied in the memory.

In some embodiments, the memory may comprise any machine-readable or computer-readable media capable of storing data, including both volatile/non-volatile memory and removable/non-removable memory. The memory may comprise at least one non-volatile memory unit. The non-volatile memory unit is capable of storing one or more software programs. The software programs may contain, for example, applications, user data, device data, and/or configuration data, or combinations therefore, to name only a few. The software programs may contain instructions executable by the various components of the controller 120 of the system 100, For example, memory may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory may contain an instruction set, in the form of a file for executing a method of generating one or more timing libraries as described herein. The instruction set may be stored in any acceptable form of machine-readable instructions, including source code or various appropriate programming languages. Some examples of programming languages that may be used to store the instruction set comprise, but are not limited to: Java, C, C, Python, Objective-C, Visual Basic, or .NET programming. In some embodiments a compiler or interpreter is comprised to convert the instruction set into machine executable code for execution by the processor.

In some embodiments, the 110 interface may comprise any suitable mechanism or component to at least enable a user to provide input (i.e., configuration parameters, etc.) to the controller 120 and the controller 120 to provide output control to the other components of the system 100 (e.g., pump, motor, etc.).

In some embodiments, the substrate 102 includes a silicon substrate. Alternatively, the substrate 102 may include other elementary semiconductor material such as, for example, germanium. The substrate 102 may also include a compound semiconductor such as silicon carbide, gallium arsenic, indium arsenide, and indium phosphide. The substrate 102 may include an alloy semiconductor such as silicon germanium, silicon germanium carbide, gallium arsenic phosphide, and gallium indium phosphide. In one embodiment, the substrate 102 includes an epitaxial layer. For example, the substrate 102 may have an epitaxial layer overlying a bulk semiconductor. Furthermore, the substrate 102 may include a semiconductor-on-insulator (SOI) structure. For example, the substrate 102 may include a buried oxide (BOX) layer formed by a process such as separation by implanted oxygen (SIMOX) or other suitable technique, such as wafer bonding and grinding. In some embodiments, the substrate 102 comprises a glass substrate, and a flexible film substrate.

In some embodiments, the RRC solvent is an organic solvent widely used to reduce photoresist consumption. In some embodiments, the PAC solvent comprises at least one of the following: Propylene Glycol Methyl Ether (PGME), propylene glycol methyl ether acetate (PGMEA), Cyclohexanone, Cyclopropanone, Methyl-N-Pentyl Ketone, Ethyl_Lactate, n-methyl-2-pyrrolidone (NMP) and a combination thereof. In some embodiments, the photoresist is sensitive to light comprising organic resin and solvent, in some embodiments, the photoresist comprises SEPR-432. It should be noted that these are just examples and are not intend to be limiting.

Figure 2A:
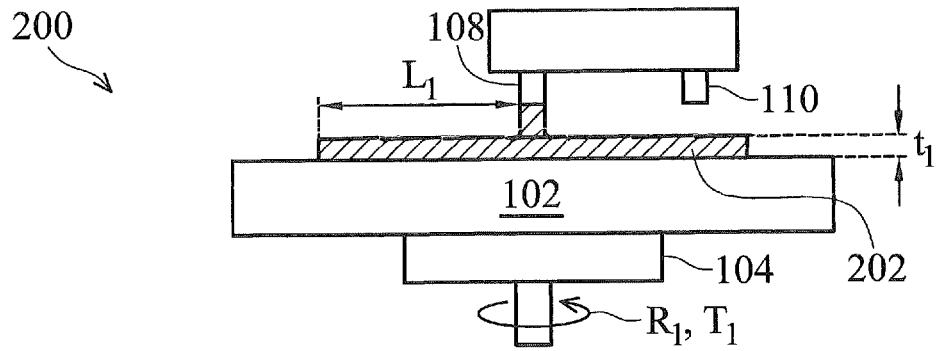
FIGS. 2A-2F illustrate cross-sections of a substrate during a spin-coating process, in accordance with some embodiments of present disclosure.
Figure 2B:
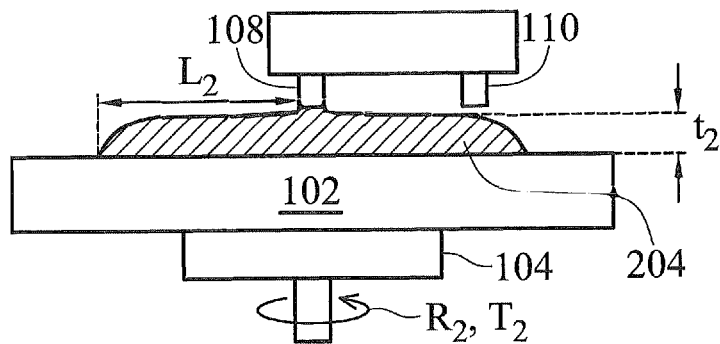
Figure 2C:
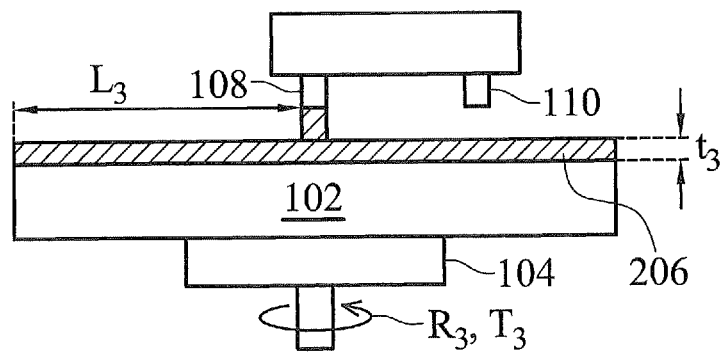
Figure 2D:
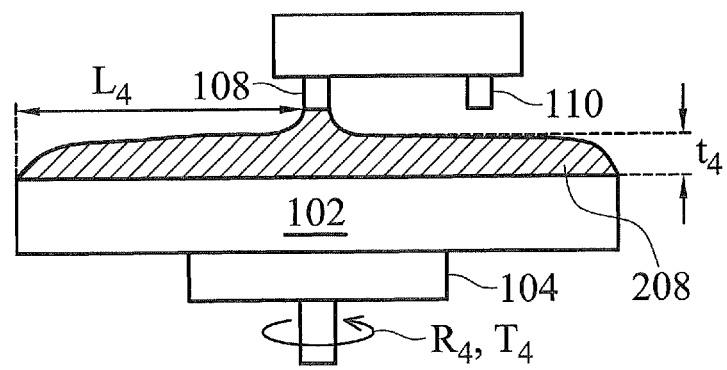
Figure 2E:
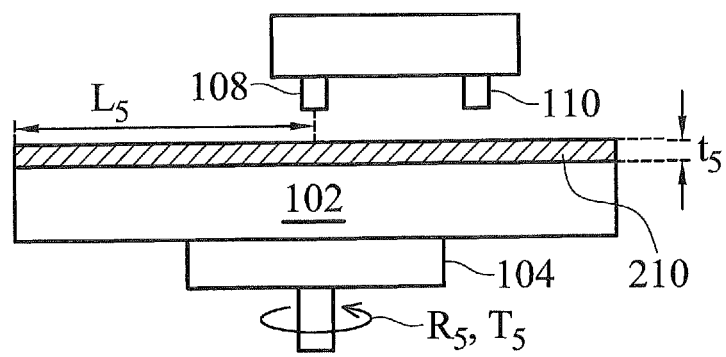
Figure 2F:
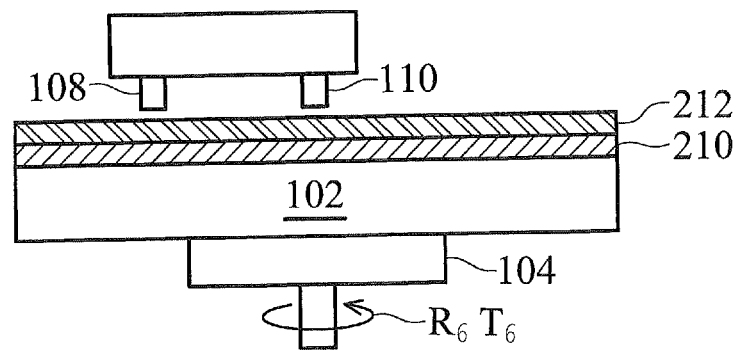

FIGS. 2A-2F illustrate cross-sections 200 of a substrate 102 during a spin-coating process, in accordance with some embodiments of present disclosure. In the illustrated embodiment, a RRC solvent is dispersed through a first nozzle 108 to a substrate 102, wherein the substrate 102 is supported on a chuck 104. In some embodiments, the chuck 104 is coupled to a motor that can provide precise control of the direction and speed of the rotational motion of the substrate 102. In some embodiments, the RRC solvent is dispersed while the substrate is spinning at a first speed R1 for a first time period. In some embodiments, R1 is in a range of 1500-3500 Revolution per minute (RPM). During this step, the RRC solvent forms a first layer 202 on the substrate which covers an area at the center of the substrate with a radius of L1 and a thickness of t1, as shown in FIG. 2A.

After T1, the substrate 102 changes its speed to a second speed R2 and the RRC solvent continues to be dispensed for a second period of time T2. In some embodiments, R2 is in a range of 500-2500 RPM and R2 is less than R1. During this step, the first layer 202 of the RRC solvent transforms to a second layer 204 covering an area in the center of the substrate 102 with a radius of L2 and a thickness of t2, wherein t2 is greater than t1 and L2 is substantially comparable to L1.

After T2, the substrate 102 changes its speed to a third speed R3 and the RRC solvent continues to be dispensed for a third period of time T3. In some embodiments, R3 is in a range of 2500-5000 RPM and R3 is greater than R1. During this step, the second layer 204 of the RRC solvent transforms to a third layer 206 covering an area in the center of the substrate 102 with a radius of L3 and a thickness of t3, wherein t3 is less than t2 and L3 is comparable to the radius of the substrate 102.

After T3, the substrate 102 changes its speed to a fourth speed R4 and the RRC solvent continues to be dispensed for a fourth period of time T4. In some embodiments, R4 is in a range of 100-2000 RPM and R4 is less than R2. During this step, the third layer 206 of the RRC solvent transforms to a fourth layer 208 covering the entire surface of the substrate 102 with a radius L4 and a thickness t4, wherein t4 is greater than t3. In some embodiments, a total time for spinning the RRC solvent, $T_{RRC}$, is a summation of T1, T2, T3 and T4. In some embodiments, T1 and T3 each takes 30-50% of $T_{RRC}$ and T2 and T4 each takes 20-30% of $T_{RRC}$. In some embodiments, TRRC is determined by the type of the RRC solvent, which is in a range of 0.6-12 seconds.

After T4, the substrate 102 changes its speed to a fifth speed R5 for a fifth period of time T5. In the illustrated embodiment, the fourth layer 208 of the RRC solvent transforms to a fifth layer 210 of the RRC solvent covering the entire surface of the substrate 102 with a radius L5 and a thickness t5. In some embodiments, the thickness t5 is smaller than the thickness t4.

After the formation of the fifth layer 210 of the RRC solvent, the photoresist is dispensed on the surface of the substrate 102 through a second nozzle 110, wherein the second nozzle 110 is first moved to the center of the stage while the first nozzle 208 moved out of the center of the stage. In some embodiments, during this step, the substrate 102 spins at the fifth speed R6 for the fifth period of time T6, wherein R6 and T6 are determined by the type of photoresist and feature size to be manufactured on the substrate 102. For example, T6=2 second for SEPR-432 and R6 is in a range of 50-500 RPM. During this step, a first layer 212 of the photoresist is formed on top of the fifth layer 210 of the RRC solvent on the substrate 102. In some embodiments, the thickness of the first layer 212 of the photoresist is controlled by the type of the photoresist, R6 and T6.

Figure 3:
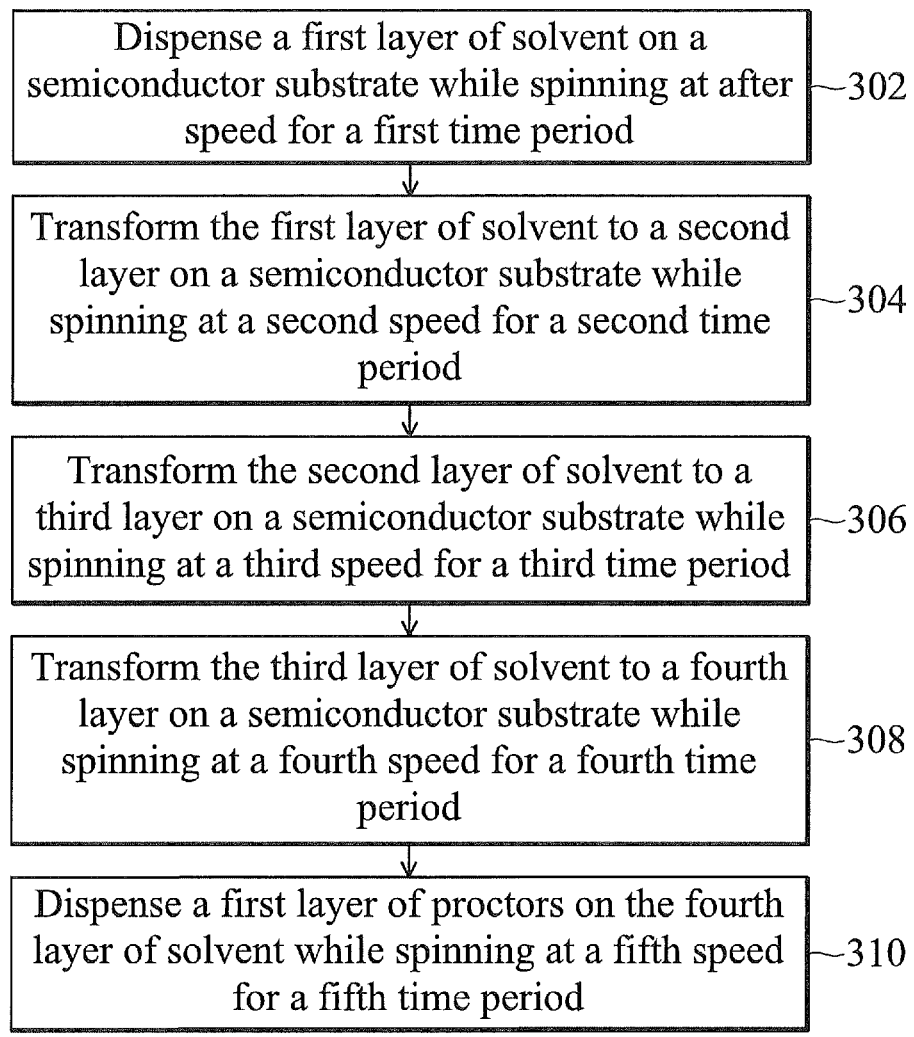
FIG. 3 illustrates a flow chart of a method to spin coat a substrate, in accordance with some embodiments of present disclosure.

FIG. 3 illustrates a flow chart of a method 300 to spin coat a substrate 102, in accordance with some embodiments of a present disclosure. In some embodiments, the operations of method 300 are performed by the respective components illustrated in FIGS. 1-2. For purposes of discussion, the following embodiment of the method 300 will be described in conjunction with FIGS. 1-2. The illustrated embodiment of the method 300 is merely an example for generating a masking map. Therefore, it should be understood that any of a variety of operations may be omitted, re-sequenced, and/or added while remaining within the scope of the present disclosure.

The method 300 starts with operation 302 in which a first layer 202 of an RRC solvent is dispensed on a substrate 102 according to some embodiments. In some embodiments, the first layer 202 of the RRC solvent is formed while the substrate 102 spins at a first speed R1 for a first time period T1. In some embodiments, R1 is in a range of 1500-3500 Revolution per minute (RPM). In some embodiments, the first layer 202 has a first thickness t1 and covers an area at the center of the substrate 102 with a radius of L1. In some embodiments, the RRC solvent is dispensed on the surface of the substrate 102 through a first nozzle 108.

The method 300 continues with operation 304 in which the first layer 202 is transformed to a second layer 204 of the RRC solvent according to some embodiments. In some embodiments, the second layer 204 of the RRC solvent is formed while the substrate 102 spins at a second speed R2 and the RRC solvent continues to be dispensed on the substrate 102 for a second period of time T2. In some embodiments, R2 is in a range of 500-2500 RPM and R2 is less than R1. In some embodiments, the second layer 204 covers an area in the center of the substrate 102 with a radius of L2 and a thickness of t2, wherein t2 is greater than t1 and L2 is substantially comparable to L1.

The method 300 continues with operation 306 in which the second layer 204 is transformed to a third layer 206 of the RRC solvent according to some embodiments. In some embodiments, the third layer 206 is formed while the substrate 102 spins at a third speed R3 and the RRC solvent continues to be dispensed for a third period of time T3. In some embodiments, R3 is in a range of 2500-5000 RPM and R3 is greater than R1. In some embodiments, the third layer 206 covers an area in the center of the substrate 102 with a radius of L3 and a thickness of t3, wherein t3 is less than t2 and L3 is comparable to the radius of the substrate 102.

In some embodiments, after the operation 304 and prior to the operation 306, at least one step of dispensing of the solvent while spinning the semiconductor wafer can be performed. In some embodiments, the semiconductor wafer can be spun at a speed which is different from the second speed and the third speed.

The method 300 continues with operation 308 in which the third layer 206 is transformed to a fourth layer 208 of the RRC solvent according to some embodiments. In some embodiments, the fourth layer 208 is formed while the substrate 102 spins at a fourth speed R4 and the RRC solvent continues to be dispensed for a fourth period of time T4. In some embodiments, R4 is in a range of 100-2000 RPM and R4 is less than R2. In some embodiments, the fourth layer 208 covers the entire surface of the substrate 102 with a radius L4 and a thickness t4, wherein t4 is greater than t3.

In some embodiments, a total time for spinning the RRC solvent, $T_{RRC}$, is a summation of T1, T2, T3 and T4. In some embodiments, T1 and T3 each takes 30-50% of $T_{RRC}$; and T2 and T4 each takes 20-30% of $T_{RRC}$. In some embodiments, TRRC is determined by the type of the RRC solvent, which is in a range of 0.6-12 seconds.

The method 300 continues with operation 310 in which a first layer 210 of a photoresist is formed on the substrate 102 according to some embodiments. In some embodiments, the first layer 210 of the photoresist is formed while the substrate 102 spins at a fifth speed R5 and the photoresist is dispensed for a fifth period of time T5. In some embodiments, the photoresist is dispensed on the surface of the substrate 102 through a second nozzle 110. In some embodiments, R5 and T5 are determined by the type of photoresist and feature size to be manufactured on the substrate 102. For example, T5=2 second for SEPR-432 and R5 is in a range of 50-5000 RPM. In some embodiments, the thickness of the first layer 210 of the photoresist is control led by the type of the photoresist, R5 and T5.

Figure 4:
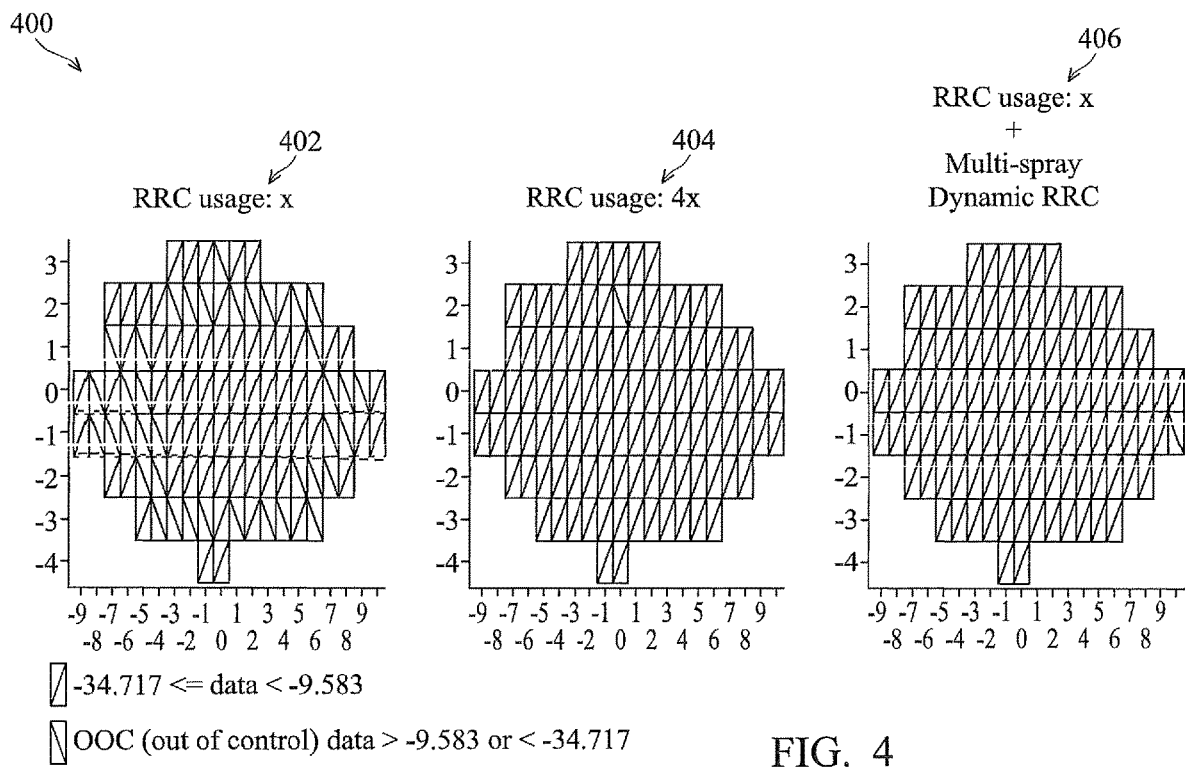
FIG. 4 illustrates maps of breakdown voltages measured on a plurality of Metal-Oxide-Semiconductor Field Effect Transistors (MOSFETs) fabricated on a substrate using three different spin-coating methods, in accordance with some embodiments of the present disclosure.

FIG. 4 illustrates maps 400 of breakdown voltages measured on a plurality of Metal-Oxide-Semiconductor Field Effect Transistors (MOSFETs) fabricated on a substrate 102 using three different spin-coating methods, in accordance with some embodiments of the present disclosure. In the illustrated embodiment, the breakdown voltages are measured by applying a first probe on a gate terminal of a MOSFET and a second probe on a body terminal of the MOSFET. In some embodiments, a first voltage of $V_0$ (e.g., −1.5 V) is applied between the first probe and the second probe, a current between a source terminal and a drain terminal of the MOSFET is measured. In some embodiments, a second voltage of $V_{stress}$, a current is measured after a fixed interval (e.g., a few milliseconds) when the voltage between the first and second probes returns to $V_0$ from $+(V_0+V_{step})$. In some embodiments, $V_{stress}=V_0+n\times V_{step}$, wherein n is a positive integer. The current is then compared with a predefined threshold current value. In some embodiments, the predefined threshold current value is 1 microampere. When the current is greater than the predefined threshold current value, the $V_{stress}$ is a breakdown voltage of the MOSFET. In the illustrated embodiments, a plurality of chips with a size of 23×9 millimeter are fabricated on a wafer. Each of the plurality of chips has an identical layout design and comprises a plurality of MOSFET devices. The breakdown voltages of the same MOSFET devices at the same position of the plurality of chips are measured and plotted to determine a distribution of defects introduced in three different photoresist coating processes. Plot 402 shows the distribution of defects on a wafer using a 1-time spin coating of the RRC solvent; plot 404 shows the distribution of defects on a wafer using a 4-time spin coating of the RRC solvent; and plot 406 shows the distribution of defects on a wafer using method 300. In the illustrated embodiments, a chip with a forward slash has a breakdown voltage in a range of −9.583 and −34.717 V, which are considered as "no defects"; and a chip with a backward slash has a breakdown voltage in a range of greater than −9.587 V or smaller than −34.717 V. The distribution and number of defects in chips fabricated using the method 300 are improved compared to that fabricated using the 1-time spin-coating of the RRC solvent and comparable to that fabricated using the 4-time spin coating of the RRC solvent. The multi-spray RRC process with dynamic control improves final yield and further reduces resist cost.

In one embodiment, a method, includes: dispensing a first layer of solvent on a semiconductor substrate while spinning at a first speed for a first time period; dispensing the solvent on the semiconductor substrate while spinning at a second speed for a second time period so as to transform the first layer to a second layer of the solvent; dispensing the solvent on the semiconductor substrate while spinning at a third speed for a third time period so as to transform the second layer to a third layer of the solvent; dispensing the solvent on the semiconductor substrate while spinning at a fourth speed for a fourth time period so as to transform the third layer to a fourth layer of the solvent; and dispensing a first layer of photoresist on the fourth layer of the solvent while spinning at a fifth speed for a fifth period of time.

In another embodiment, a method, includes: dispensing a first layer of solvent on a semiconductor substrate while spinning at a first speed for a first time period; dispensing the solvent on the semiconductor substrate while spinning at a second speed for a second time period so as to transform the first layer to a second layer of the solvent; dispensing the solvent on the semiconductor substrate while spinning so as to transform the second layer to a third layer of the solvent; dispensing the solvent on the semiconductor substrate while spinning at a third speed for a third time period so as to transform the third layer to a fourth layer of the solvent; dispensing the solvent on the semiconductor substrate while spinning at a fourth speed for a fourth time period so as to transform the fourth layer to a fifth layer of the solvent; and dispensing a first layer of photoresist on the fifth layer of the solvent while spinning at a fifth speed for a fifth period of time.

Yet, in another embodiment, a method, includes: dispensing a first layer of solvent on a semiconductor substrate while spinning at a first speed for a first time period; dispensing the solvent on the semiconductor substrate while spinning at a second speed for a second time period so as to transform the first layer to a second layer of the solvent; dispensing the solvent on the semiconductor substrate while spinning at a third speed for a third time period so as to transform the second layer to a third layer of the solvent; dispensing the solvent on the semiconductor substrate while spinning at a fourth speed for a fourth time period so as to transform the third layer to a fourth layer of the solvent; and dispensing a first layer of photoresist on the fourth layer of the solvent while spinning at a fifth speed for a fifth period of time, wherein the third speed is greater than the first speed, wherein the first speed is greater than the second speed, and wherein the second speed is greater than the fourth speed, wherein the first time period and the third time period each equals to 30-50% of a summation of the first time period, the second time period, the third time period, and the fourth time period, and wherein the second time period and the fourth time period each equals to 20-30% of a summation of the first time period, the second time period, the third time period, and the fourth time period.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   dispensing a first layer of solvent on a substrate while spinning at a first speed for a first time period such that the first layer of the solvent covers a first area of the substrate with a first radius and a first thickness;
   dispensing the solvent on the substrate while spinning at a second speed for a second time period so as to transform the first layer to a second layer of the solvent such that the second layer of the solvent covers a second area of the substrate with a second radius and a second thickness, wherein the second speed is less than the first speed; and
   dispensing the solvent on the substrate while spinning at a third speed for a third time period so as to transform the second layer to a third layer of the solvent such that the third layer of the solvent covers a third area of the substrate with a third radius and a third thickness, wherein the first and second radii are less than the third radii, and wherein the first and third thicknesses are less than the second thickness.

2. The method of claim 1, wherein the first speed is in a range of 1500-3500 revolutions per minute (RPM).

3. The method of claim 2, wherein the second speed is in a range of 500-2500 RPM.

4. The method of claim 3, wherein the third speed is in a range of 2500-5000 RPM.

5. The method of claim 4, further comprising:
   dispensing the solvent on the substrate while spinning at a fourth speed for a fourth time period following the third time period so as to transform the third layer to a fourth layer of the solvent such that the fourth layer of the solvent covers a fourth area of the substrate with a fourth radius and a fourth thickness, wherein the first and second radii are less than the third and fourth radii, respectively, the first and third thicknesses are less than the second and fourth thicknesses, respectively, and wherein the fourth speed is in a range of 100-2000 RPM.

6. The method of claim 5, wherein the third speed is greater than the first speed and the second speed is greater than the fourth speed.

7. The method of claim 5, wherein the first time period and the third time period each equals to 30-50% of a summation of the first time period, the second time period, the third time period, and the fourth time period, wherein the summation is in a range of 0.6-12 seconds.

8. The method of claim 5, wherein the second time period and the fourth time period each equals to 20-30% of a summation of the first time period, the second time period, the third time period, and the fourth time period, wherein the summation is in a range of 0.6-12 seconds.

9. The method of claim 1, wherein each dispensing of the solvent is performed at a flow rate of 60-90 milliliter per minute (mL/m).

10. A method, comprising:
dispensing a first layer of solvent on a substrate while spinning at a first speed for a first time period such that the first layer of the solvent covers a first area of the substrate with a first radius and first thickness;
dispensing the solvent on the substrate while spinning at a second speed for a second time period following the first time period so as to transform the first layer to a second layer of the solvent such that the second layer of the solvent covers a second area of the substrate with a second radius and second thickness;
dispensing the solvent on the substrate while spinning so as to transform the second layer to a third layer of the solvent such that the third layer of the solvent covers a third area of the substrate with a third radius and a third thickness;
dispensing the solvent on the substrate while spinning at a third speed for a third time period following the second time period so as to transform the third layer to a fourth layer of the solvent such that the fourth layer of the solvent covers a fourth area of the substrate with a fourth radius and fourth thickness, wherein the first and second radii are substantially equal to each other and each less than each of the third and fourth radii, and wherein the first and third thicknesses are substantially equal to each other and each less than each of the second and fourth thicknesses;
dispensing the solvent on the substrate while spinning at a fourth speed for a fourth time period following the third time period so as to transform the fourth layer to a fifth layer of the solvent;
dispensing a first layer of photoresist on the fifth layer of the solvent while spinning at a fifth speed for a fifth period of time following the fourth time period,
wherein the second speed is less than the first speed and the third speed is greater than the first speed, the fourth speed is less than the second speed and the fifth speed is less than the fourth speed.

11. The method of claim 10, wherein the first speed is in a range of 1500-3500 revolutions per minute (RPM).

12. The method of claim 10, wherein the second speed is in a range of 500-2500 revolutions per minute (RPM).

13. The method of claim 10, wherein the third speed is in a range of 2500-5000 revolutions per minute (RPM).

14. The method of claim 10, wherein the fourth speed is in a range of 100-2000 revolutions per minute (RPM).

15. The method of claim 10, wherein the fifth speed is in the range of 50 to 500 revolutions per minute (RPM).

16. The method of claim 10, wherein the first time period and the third time period each equals to 30-50% of a summation of the first time period, the second time period, the third time period, and the fourth time period, wherein the summation is in a range of 0.6-12 seconds.

17. The method of claim 10, wherein the second time period and the fourth time period each equals to 20-30% of a summation of the first time period, the second time period, the third time period, and the fourth time period, wherein the summation is in a range of 0.6-12 seconds.

18. A method, comprising:
dispensing a first layer of solvent on a substrate while spinning at a first speed for a first time period such that the first layer of the solvent covers a first area of the substrate with a first radius and a first thickness;
dispensing the solvent on the substrate while spinning at a second speed for a second time period following the first time period so as to transform the first layer to a second layer of the solvent such that the second layer of the solvent covers a second area of the substrate with a second radius and a second thickness;
dispensing the solvent on the substrate while spinning at a third speed for a third time period following the second time period so as to transform the second layer to a third layer of the solvent such that the third layer of the solvent covers a third area of the substrate with a third radius and a third thickness;
dispensing the solvent on the substrate while spinning at a fourth speed for a fourth time period following the third time period so as to transform the third layer to a fourth layer of the solvent such that the fourth layer of the solvent covers a fourth area of the substrate with a fourth radius and fourth thickness, wherein the first and second radii are substantially equal to each other and each different from the third and fourth radii, and wherein the first and third thicknesses are substantially equal to each other and each different from each of the second and fourth thicknesses; and
dispensing a first layer of photoresist on the fourth layer of the solvent while spinning at a fifth speed for a fifth period of time,
wherein the third speed is greater than the first speed, wherein the first speed is greater than the second speed, and wherein the second speed is greater than the fourth speed, wherein the first time period and the third time period are each greater than each of the second time period and the fourth time period.

19. The method of claim 18, wherein the first speed is in a range of 1500-3500 revolution per minute (RPM), the second speed is in a range of 500-2500 RPM, the third speed is in a range of 2500-5000 RPM, and the fourth speed is in a range of 100-2000 RPM.

20. The method of claim 18, wherein a summation of the first, second, third and fourth time periods is in a range of 0.6-12 seconds.

* * * * *